United States Patent
Bae et al.

(10) Patent No.: US 6,528,401 B2
(45) Date of Patent: Mar. 4, 2003

(54) METHOD FOR FABRICATING POLYCIDE DUAL GATE IN SEMICONDUCTOR DEVICE

(75) Inventors: Jong Uk Bae, Chungcheongbuk-do (KR); Ji Soo Park, Chungcheongbuk-do (KR); Dong Kyun Sohn, Chungcheongbuk-do (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 48 days.

(21) Appl. No.: 09/735,544

(22) Filed: Dec. 14, 2000

(65) Prior Publication Data

US 2001/0006832 A1 Jul. 5, 2001

(30) Foreign Application Priority Data

Dec. 31, 1999 (KR) .............................................. 99-67706

(51) Int. Cl.$^7$ ......................................... H01L 21/4763
(52) U.S. Cl. ...................... 438/592; 438/585; 438/590; 438/682; 438/683; 438/685; 438/655; 438/656; 438/657; 438/660; 438/663; 438/664; 438/227; 438/199; 438/229
(58) Field of Search ................................ 438/585, 592, 438/590, 682, 683, 685, 655, 656, 657, 660, 663, 664, 227, 199, 229

(56) References Cited

U.S. PATENT DOCUMENTS

| | | | |
|---|---|---|---|
| 5,563,093 A | * 10/1996 | Koda et al. | |
| 5,880,502 A | * 3/1999 | Lee et al. | 257/372 |
| 5,953,612 A | * 9/1999 | Lin et al. | 438/299 |
| 5,976,939 A | * 11/1999 | Thompson et al. | 438/305 |
| 6,074,921 A | * 6/2000 | Lin | 438/299 |
| 6,140,216 A | * 10/2000 | Richart et al. | 438/592 |
| 6,143,613 A | * 11/2000 | Lin | 438/299 |
| 6,228,722 B1 | * 5/2001 | Lu | 438/279 |
| 6,261,889 B1 | * 7/2001 | Ono | 438/232 |
| 6,177,319 B1 | * 1/2002 | Chen | 438/275 |

OTHER PUBLICATIONS

Iwata et al. "A New Tungsten Gate Process for VLSI Applications" IEEE Transactions on Electron Devices, vol. ED–31, No. 9, Sep. 1984, pp. 1174–1179.

M. Tanielian et al. Controlling the Titanium Silicide Penetration Into The Polysilicon During Oxidation of $TiSi_2$ Polysilicon Structures, IEEE Electron Device Letters, vol. EDL–6, No. 5, May 1985, pp. 221–223.

K.A. Jenkins et al. "Submicron CMOS Gate Electrode Discontinuity: Electrical Signature and Effect on Circuit Speed" Tech. Dig Int. Elec. Dev. Meet., 891, IEEE 1993, pp. 891–894.

J.B. Lasky et al. "Comparison of Transformation to Low –Resistivity Phase and Agglomeration of $TiSi_2$ and $CoSi_2$" IEEE Transactions on Electron Devices, vol. 38, No. 2, Feb. 1991, pp. 262–269.

(List continued on next page.)

*Primary Examiner*—Long Pham
(74) *Attorney, Agent, or Firm*—Fleshner & Kim, LLP

(57) ABSTRACT

Method for fabricating a polycide dual gate in a semiconductor device fabricates a dual gate having polycide gate electrodes. The polycide can be a cobalt polycide, for example. The method can include forming polysilicon pattern layers on a first and a second regions of a semiconductor substrate, forming a blocking layer to expose top surfaces of the polysilicon pattern layers and mask the substrate, and forming a metal layer on an entire surface and then is annealed to form a gate electrode having a stack of the polysilicon pattern layer under a silicide layer. Impurity ions of opposite conductivities in the first and second regions can be respectively deposited and diffused to form source/drain regions in surfaces of the substrate on both sides of the gate electrode. The implanted impurity ions can further implant ions in the silicide/polysilicon pattern layer gate to reduce fabrication steps or simplify the fabrication process.

18 Claims, 7 Drawing Sheets

OTHER PUBLICATIONS

K. Maex et al. "Degradation of Doped Si Regions Contacted with Transition–Metal Silicides Due to Metal–Dopant Compound Formation" J. App. Phys. 66 (11), Dec. 1, 1988, pp. 5327–5334.

F.C. Shone et al. "Modeling Dopant in $SiO_2/WSi_2/Si$ Structure" Integrated Circuits Laboratory, Stanford University, IEEE 1986, pp. 534–537.

F. Fracassi et al. "Plasma Assisted Dry Etching of Colbalt Silicide for Microelectronics Applications" J. Electochem. Co., vol. 143, No. 2, Feb. 1996, pp. 701–707.

A.E. Morgan et al. "Self–Aligned Cobalt Silicide Process" J. Electrochem. Soc., vol. 134, No. 4 (1987) pp. 927–935.

* cited by examiner

METHOD FOR FABRICATING POLYCIDE DUAL GATE IN SEMICONDUCTOR DEVICE

BACKGROUND OF THE INVENTION

1. Field of the Invention

The present invention relates to a semiconductor device, and more particularly, to a method for fabricating a semiconductor device.

2. Background of the Related Art

A related art dual gate in a semiconductor device will now be described. FIGS. 1A~1E illustrate sections showing the steps of a related art method for fabricating a dual gate.

As shown in FIG. 1A, the related art method for fabricating a dual gate starts with forming device isolating layers 2 in device isolating regions of a semiconductor substrate 1 by LOCOS or STI. N type and P type impurity ions are implanted in active regions defined by the device isolating regions 2 to form P type well region 3 and N type well region 4. Then, a gate oxide film 5, and an undoped polysilicon layer 6 as a gate forming material layer are formed on an entire surface inclusive of the P type well region 3 and the N type well region 4. A photoresist film is coated on an entire surface, and selectively patterned, to form a first photoresist film pattern layer 7. The first photoresist film pattern layer 7 is used as a mask in implanting 'n' type impurity ions in an exposed surface of the undoped polysilicon layer 6. The 'n' type impurity ion implantation forms an 'n' type impurity implanted layer 6a on the P type well region 3.

As shown in FIG. 1B, the first photoresist film pattern layer 7 is removed. A photoresist film is coated again, and selectively removed to leave the photoresist film only on the P type well region 3, which forms a second photoresist pattern layer 8. The second photoresist pattern layer 8 is used as a mask in implanting 'p' type impurity ions in an exposed surface of the undoped polysilicon layer 6. The 'p' type impurity ion implantation forms a 'p' type impurity implanted layer 6b on the N type well region 4.

As shown in FIG. 1C, a barrier layer 10 of a tungsten silicide or tungsten, and a hard mask layer 11 for gate patterning are formed on the 'n' type impurity implanted layer 6a and the 'p' type impurity implanted layer 6b. The hard mask layer 11 for gate patterning is formed of an oxide or a nitride. Then, a photoresist film is coated on the hard mask layer 11 and selectively patterned to form a third photoresist film pattern layer 9

As shown in FIG. 1D, the third photoresist film pattern layer 9 is used as mask in selectively patterning exposed portions of the hard mask layer 11 for gate patterning, which is used as a hard mask in selectively etching the barrier layer 10, and the polysilicon layers 6a and 6b to form gates 12a and 12b. As shown in FIG. 1E, an oxide or nitride film is deposited on an entire surface inclusive of the gates 12a and 12b, and subjected to anisotropic etching to form sidewalls 13 at sides of the gates. Though not shown on the drawing, photoresist film mask patterns are alternatively formed on the P type well 3 and the N type well 4 to implant n type impurities in the P type well region 3 by using the gate 12a as a mask to form source/drain regions 14a, and to implant p type impurities in the n type well region 4 by using the gate 12b as a mask to form source/drain regions 14b. Thus, by forming an n-polygate and a p-polygate on one wafer in the same process, fabrication of a logic circuit is made simple.

As described above, the related art method for fabricating a dual gate has various disadvantages. Since the dual gate is formed by implanting impurity ions using a single polysilicon layer, the gate short channel effect caused by employment of a buried PMOS, if a PMOS is required, for optimization of device performances impedes formation of a device having a gate length below 0.25 μm. Further, the formation of two sheets of masks required after deposition of the polysilicon layer and in the formation of the source/drain in fabrication of the dual gate (i.e., for providing an n-poly in an NMOS, and a p-poly in a PMOS) leads to additional fabrication steps that increase production costs. The implantation of ions in the polysilicon layer can damage the gate oxide film if the polysilicon layer is thin (below 500 Å), which impedes a regular fabrication because too low an energy should be used in implanting ions in formation of p+ poly. Since it is impossible to drop a sheet resistivity below 10 Ω/m even if the tungsten silicide is deposited to a thickness greater than than 1000 Å as the tungsten silicide has at best a resistivity in a range of 100 μΩm, the tungsten silicide is not suitable for use as a barrier layer. If a tungsten layer, not the tungsten silicide layer, is used to reduce the resistance, an additional diffusion barrier of TiN or WN is required to prevent a reaction with silicon. Also, a re-oxidation is required for restoring the damage to the gate oxide film from the etching since the tungsten is vulnerable to reaction with oxygen, which causes selective oxidation. However, the selective oxidation has difficulty in process control that deteriorates reproducibility. See S. Iwata et al., IEEE Trans. Elec. Dev. ED-31, 1174 (1984). The re-oxidation causes a problem of oxidizing the polycide. See M. Tanielian et al., IEEE Tran. Elec. Dev. Lett. EDL-6, 221 (1985), and K. A. Jenkins et al., Tech. Dig Int. Elec. Dev. Meet., 891(1993).

The above references are incorporated by reference herein where appropriate for appropriate teachings of additional or alternative details, features and/or technical background.

SUMMARY OF THE INVENTION

An object of the invention is to solve at least the above problems and/or disadvantages and to provide at least the advantages described hereinafter Another object of the present invention is to provide a method for fabricating a polycide dual gate in a semiconductor device that substantially obviates one or more problems caused by limitations and disadvantages of the related art.

Another object of the present invention is to provide a method for fabricating a polycide dual gate in a semiconductor device having a dual gate of cobalt polycide.

Another object of the present invention is to provide a method for fabricating a polycide dual gate in a semiconductor device that has an excellent thermal stability and a low resistance.

Another object of the present invention is to provide a method for fabricating a polycide dual gate in a semiconductor device that can be patterned using a time and cost efficient fabrication process.

Another object of the present invention is to provide a method for fabricating a polycide dual gate in a semiconductor device that has a reduced gate length below 0.25 μm.

Another object of the present invention is to provide a method for fabricating a polycide dual gate in a semiconductor device that implants source/drain regions concurrently with gate ions.

Another object of the present invention is to provide a method for fabricating a polycide dual gate in a semiconductor device that diffuses ions into a silicide layer to reduce a thickness of a polysilicon layer.

Another object of the present invention is to provide a method for fabricating a polycide dual gate in a semiconductor device that can eliminate a low energy ion implanting equipment from a fabrication process.

Another object of the present invention is to provide a method for fabricating a polycide dual gate in a semiconductor device that has a low resistivity without a diffusion prevention layer in the gate electrode.

Another object of the present invention is to provide a method for fabricating a polycide dual gate in a semiconductor device that reduces oxidation damage to a polycide layer.

To achieve at least these objects and other advantages in a whole or in part and in accordance with the purpose of the present invention, as embodied and broadly described, a method for fabricating a polycide dual gate in a semiconductor device includes (1) forming polysilicon pattern layers on a first and a second regions of a semiconductor substrate, (2) forming a blocking layer level with exposed top surfaces of the polysiliconpattern layers, (3) forming and annealing a cobalt layer on an entire surface to form a gate electrode having a stack of the polysilicon pattern layer and a cobalt silicide layer, and (4) implanting ions of opposite conductivities in the first and second regions respectively and annealing to form source/drain regions in surfaces of the substrate on both sides of the gate electrode, and to implant gate ions in the polysilicon pattern layer.

To further achieve the above objects and advantages in a whole or in part, there is provided a method for fabricating a polycide dual gate in a semiconductor device that includes forming polysilicon pattern layers over a first and a second regions of a semiconductor substrate, forming a blocking layer to expose top surfaces of the polysilicon pattern layers, annealing a refractory metal into the polysilicon patterns to form a gate electrode having a refractory metal silicide layer and forming source/drain regions in surfaces of the substrate on both sides of the gate electrodes.

To further achieve the above objects and advantages in a whole or in part, there is provided a method for fabricating a polycide dual gate in a semiconductor device that includes forming a first conductivity type well region and a second conductivity type well region in surfaces of a semiconductor substrate, forming a gate oxide film and an undoped polysilicon layer on the well regions of the substrate that are selectively etched to form polypattern layers, implanting first conductivity type impurity ions in the polypattern layers over the second conductivity type well region and an exposed surface of the second conductivity type well region, implanting second conductivity type impurity ions in the polypattern layers over the first conductivity type well region and an exposed surface of the first conductivity type well region, annealing to form first conductivity type sources/drains in the second conductivity type well region and second conductivity type sources/drains in the first conductivity type well region, forming sidewalls at sides of the polypattern layers, forming a blocking layer to expose top surfaces of the polypattern layers and to mask a surface of the substrate and depositing a cobalt layer on an entire surface and annealing to form gate electrodes each having a polycide structure with a stack of the polypattern layer below a silicide layer.

To further achieve the above objects and advantages in a whole or in part, there is provided a method for fabricating a polycide dual gate in a semiconductor device that includes forming a first conductivity type well region and an second conductivity type well region in surfaces of a semiconductor substrate, forming a gate oxide film and an undoped polysilicon layer that are selectively etched to form polypattern layers on the well regions, forming a blocking layer to expose top surfaces of the polypattern layers and mask the well regions, depositing a cobalt layer on the polypattern layers and the blocking layer, annealing to form gate electrodes of a polycide structure each with a stack of the polypattern layer and a silicide layer, forming sidewalls at sides of the gate electrodes, implanting second conductivity type impurity ions and first conductivity type impurity ions in the first conductivity type well region and the second conductivity type well region, respectively, and diffusing to form source/drain regions.

It is to be understood that both the foregoing general description and the following detailed description are exemplary and explanatory and are intended to provide further explanation of the invention as claimed.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Reference will now be made in detail to the preferred embodiments of the present invention, examples of which are illustrated in the accompanying drawings. A method for fabricating a dual gate in accordance with a first preferred embodiment of the present invention will now be described. FIGS. 2A~2G are diagrams that illustrate crossections showing the first preferred embodiment of a method for fabricating a dual gate. As a design rule of a semiconductor device becomes strict, an operation speed of the semiconductor device drops because of a high gate resistance. Therefore, a gate electrode with a low resistance is required. A refractory metal silicide with a low resistance is preferably used for the low resistance gate electrode, which is called a polycide (silicide on doped polycrystalline-Si). Though what has been used as the polycide most widely is $WSi_2$ (resistivity 60~200 $\mu\Omega cm$), as a device size reduced, $CoSi_2$ (15~20$\mu\Omega cm$) and $TiSi_2$ (15~20 $\mu\Omega cm$) can be used. Preferred embodiments according to the present invention employ $CoSi_2$ for providing a dual gate of a low resistance using a time and cost efficient fabrication process. However, the present invention is not intended to be so limited.

Figure 1A:
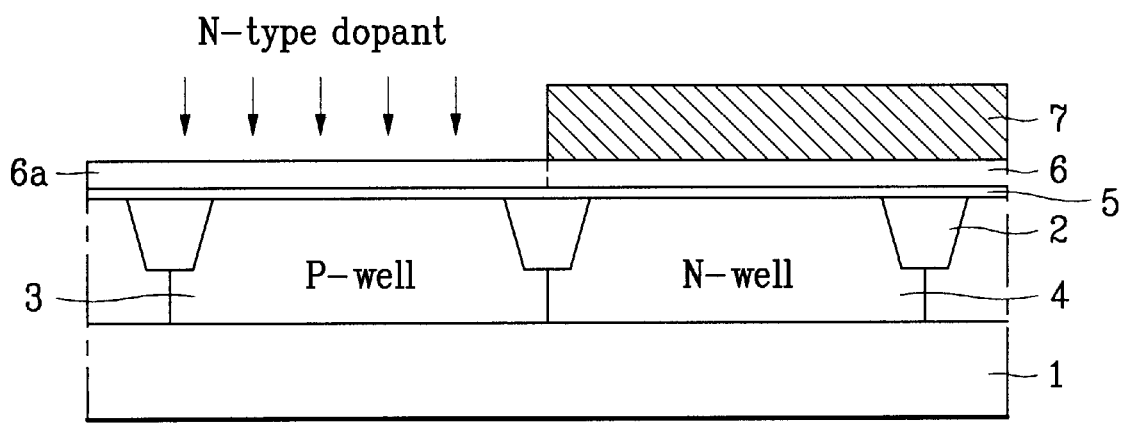
FIGS. 1A~E illustrate sections showing the steps of a related art method for fabricating a dual gate.
Figure 1B:
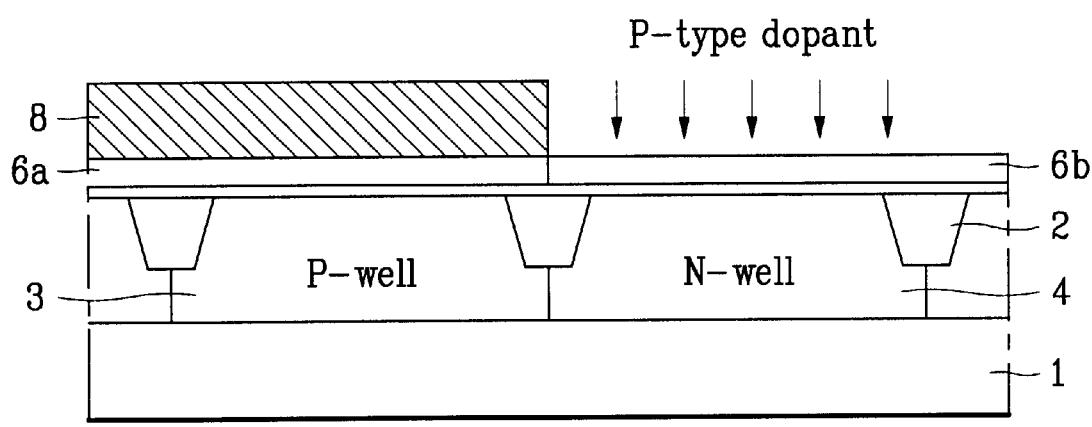
Figure 1C:
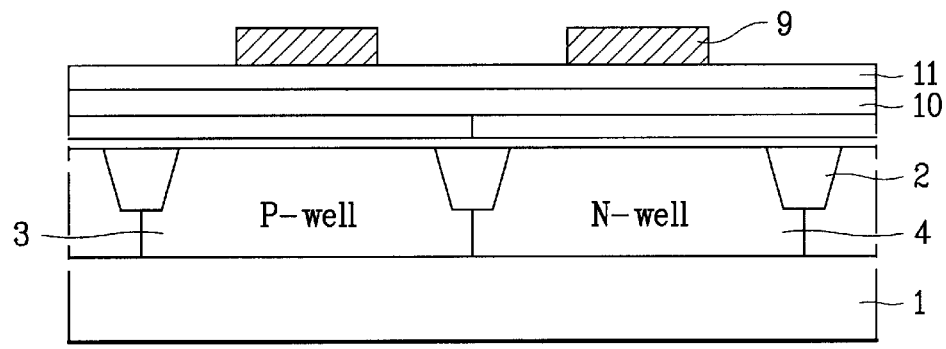
Figure 1D:
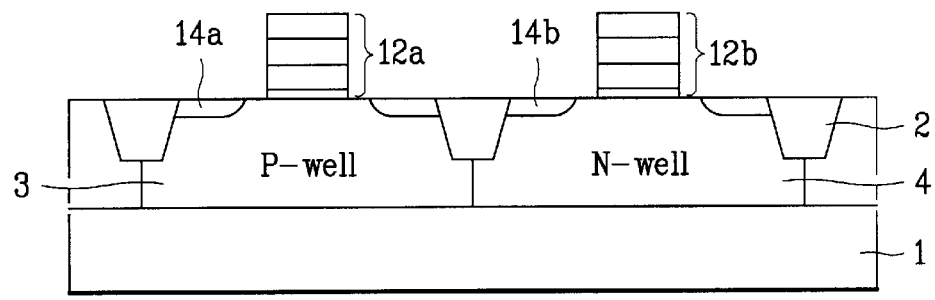
Figure 1E:
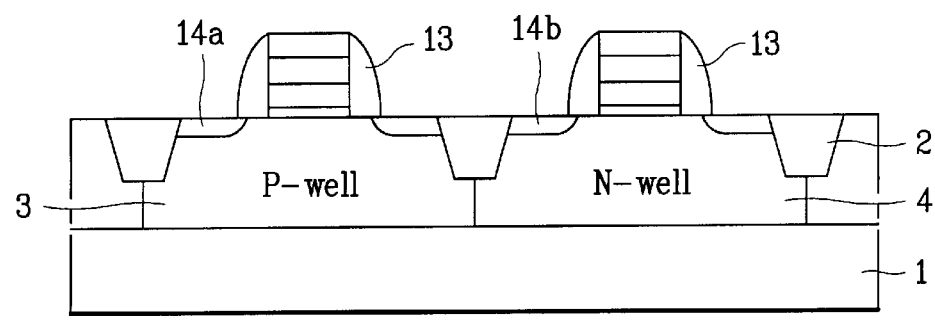
Figure 2A:
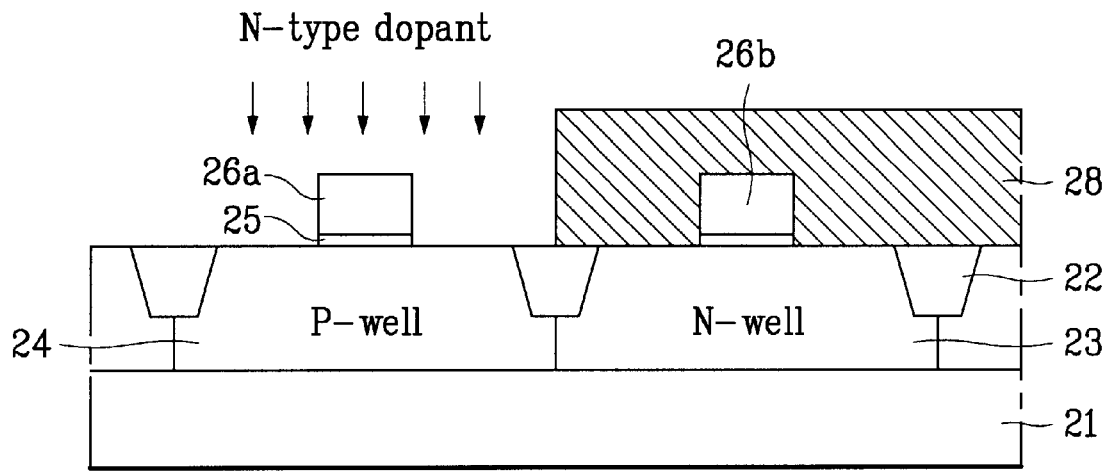
FIGS. 2A~2G are diagrams that illustrate sections showing a method for fabricating a dual gate in accordance with a first preferred embodiment of the present invention.

As shown in FIG. 2A, device isolating layers 22 are formed in device isolating regions of a semiconductor substrate 21 by LOCOS or STI. N type and P type impurity ions are respectively implanted in first and second active regions defined by the device isolating layers 22 for forming an N type well region 23 and a P type well region 24. Then, a gate oxide film 25 and undoped polysilicon layer are formed on an entire surface, and selectively etched by photolithography or the like (not shown) to form polypattern layers 26a and 26b. A photoresist film is coated on an entire surface and selectively patterned to leave the photoresist film only on the N type well region 23 to form a first photoresist film pattern layer 28. The first photoresist film pattern layer 28 is used as a mask in implanting 'n' type impurity ions in the polypattern layer 26a and an exposed surface of the substrate.

Figure 2B:
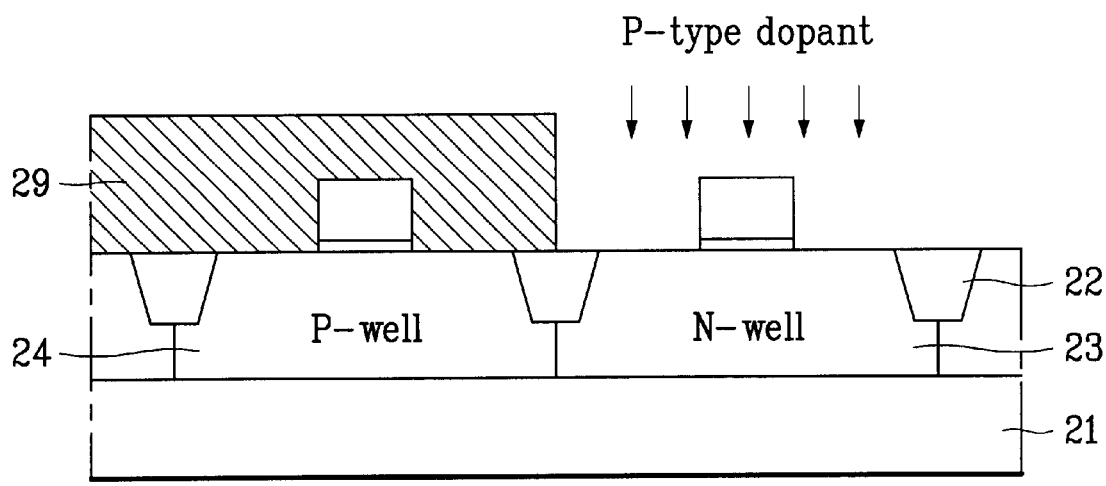

As shown in FIG. 2B, the first photoresist film pattern layer 28 is removed, and a photoresist film is coated again. The photoresist film is selectively patterned to leave the photoresist film only on the P type well region 24 to form a second photoresist film pattern layer 29. The second photoresist film pattern layer 29 is used as a mask in implanting 'p' type impurity ions in the polypattern layer 26b and an exposed surface of the substrate.

Figure 2C:
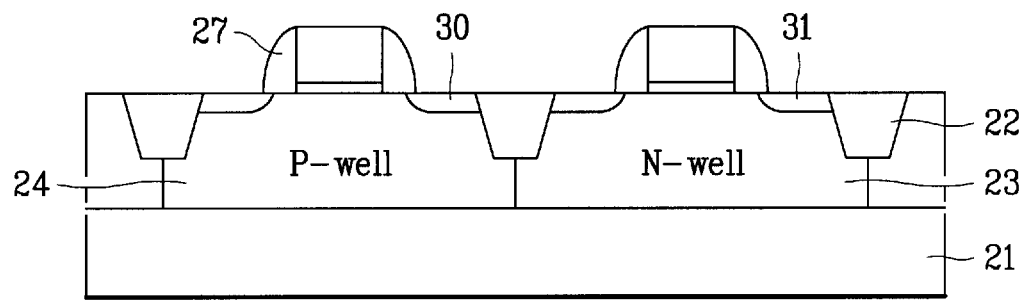
Figure 2D:
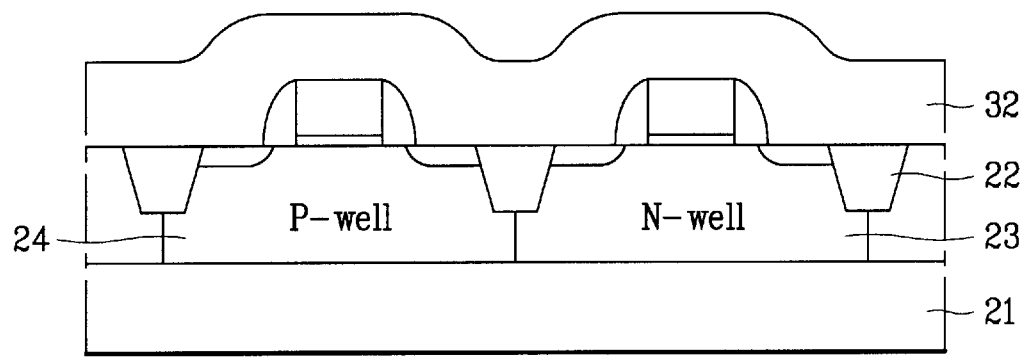
Figure 2E:
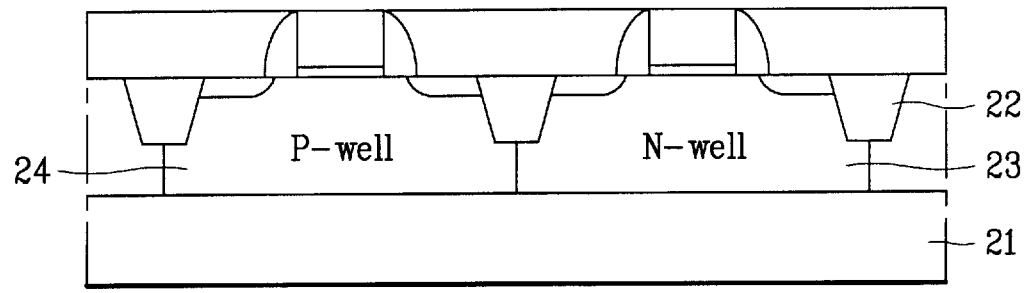
Figure 2F:
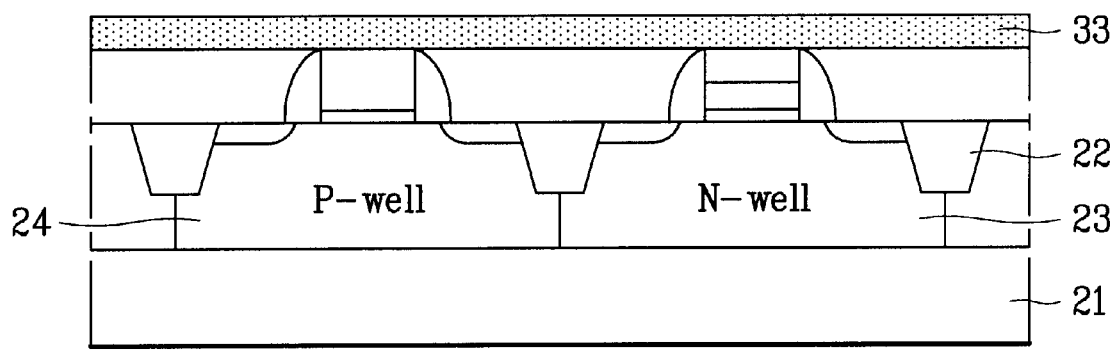

As shown in FIG. 2C, annealing is preferable conducted to form n type source/drain 30 and p type source/drain 31 in an NMOS and a PMOS regions, respectively. Then, the second photoresist film pattern layer 29 is removed, and a nitride film (or oxide film and the like) is deposited and preferably subjected to anisotropic etching to form gate sidewalls 27 at sides of the polypattern layers 26a and 26b. As shown in FIG. 2D, an oxide film (or nitride film and the like) is deposited on an entire surface, which has an etch selectivity over the gate sidewalls 27, to form a blocking layer 32. As shown in FIG. 2E, the blocking layer 32 is planarized by Chemical Mechanical Polishing (CMP) until top surfaces of the polypattern layers 26a and 26b are exposed. As shown in FIG. 2F, a cobalt layer 33 is formed (e.g., deposited) on an entire surface inclusive of the planarized blocking layer 32 and the polypattern layers 26a and 26b.

Figure 2G:
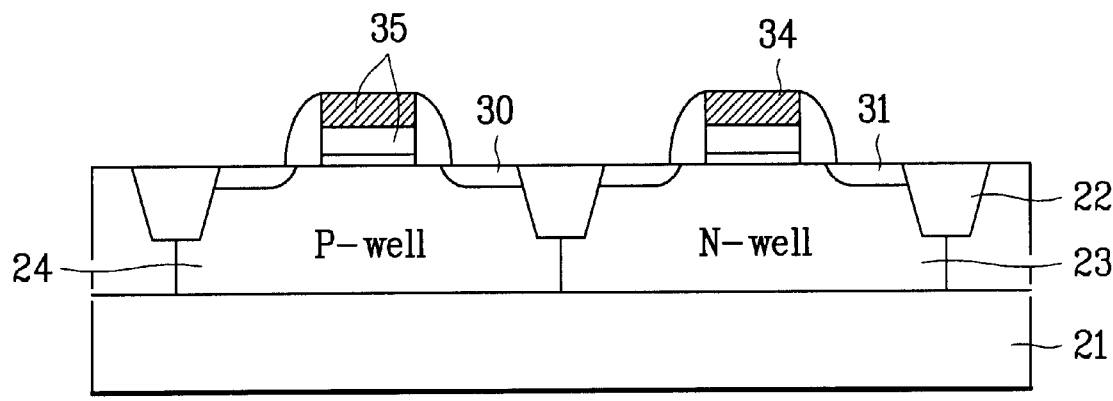

As shown in FIG. 2G, the silicon and the cobalt in the exposed polypattern layers 26a and 26b and the cobalt layer 33 are caused to make a reaction, which forms a cobalt silicide $CoSi_2$ layers 34, to form gate electrodes 35 of polycide structures each having a stack of the polypattern layer and the silicide layer. The cobalt on the blocking layer 32 that does not react with the silicon is removed preferably by a wet chemical process.

The preferred embodiments according to the present invention use, not $TiSi_2$, but $CoSi_2$ for various reasons. $CoSi_2$ has an excellent thermal stability, though $TiSi_2$ and $CoSi_2$ have similar resistances. Silicides agglomerate in a thermal process conducted after the silicide is formed, which increases a resistance. $CoSi_2$ agglomerates less than $TiSi_2$. (See for example, J. B. Lasky et al. IEEE Trans. Elec. Dev., 38, 262 (1991). Further, although $TiSi_2$ is involved in a great increase of a resistance as a width of a gate is decreased, $CoSi_2$ maintains a low resistance even if the width of the gate is decreased. Since $CoSi_2$ can be used as an Silicide as A Dopant Source (SADS), silicon doping is simplified. The SADS is a method in which dopant is implanted in a silicide and annealed when diffusing the dopant into underlying silicon layer. $TiSi_2$ cannot be used as SADS because of a high reactivity with dopants, such as As, P, B and the like, however, $CoSi_2$ is used widely as SADS. (See for example, K. Maex et al., J. Appl. Phys., 66, 5327 (1989), F. C. Shone et al., Tech. Dig. Int. Elec. Dev. Meet., (1986), p. 407). Despite such advantages, $CoSi_2$ is not applied to mass production because of a difficulty in etching. (See for example, F. Fracassi et al., J. Electrochem. Soc., 143, 701 (1996)). Though $TiSi_2$ can be dry etched readily by converting $TiSi_2$ into volatile TiF or $TiCi_2$, $CoSi_2$ is difficult to etch as $CoSi_2$ has no volatile compound and is very stable in terms of chemistry. (See for example, A. E. Morgan et al., J. Electrochem. Soc., 134, 925–935 (1987)). Therefore, the preferred embodiments according to the present invention describe formation of a dual gate of a polycide, not by forming a silicide on an entire surface and subjecting to etching, but by forming the silicide partly on required portions and removing cobalt in portions that do not react with silicon by wet chemical process. Thus, the $CoSi_2$ is patterned.

The above references are incorporated by reference herein.

A method for fabricating a dual gate in accordance with a second preferred embodiment of the present invention will now be described. The second preferred embodiment of a method of fabricating a dual gate according to the present invention uses a property of the cobalt silicide that the cobalt silicide does not react with a dopant enough to be used as a diffusion source. According to the second preferred embodiment, ions are implanted in the cobalt silicide and diffused into the polypattern layer by annealing to form the dual gate.

Figure 3A:
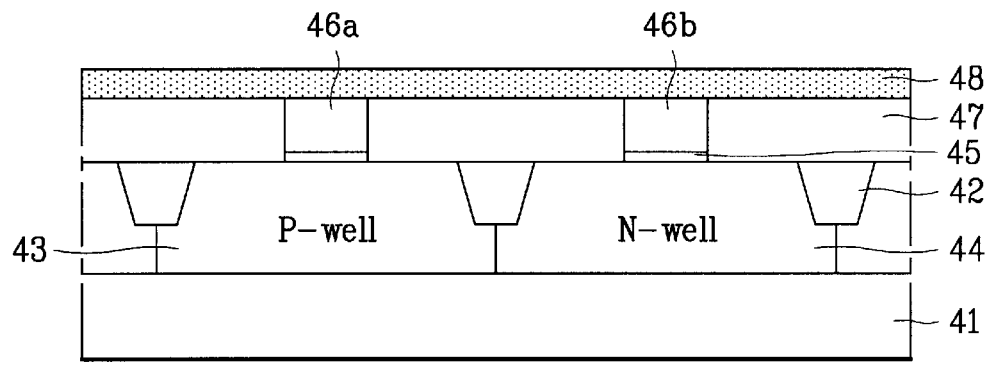
FIGS. 3A~3E are diagrams that illustrate sections showing a method for fabricating a dual gate in accordance with a second preferred embodiment of the present invention.

FIGS. 3A~3E are diagrams that illustrate cross-sections showing a method for fabricating a dual gate in accordance with the second preferred embodiment of the present invention. As shown in FIG. 3A, device isolating layers 42 are formed in device isolating regions in a semiconductor substrate by LOCOS, STI or the like. N type and P type impurity ions are respectively implanted in a first and a second active regions defined by the device isolating layers to form a P type well region 43 and an N type well region 44. Then, a gate oxide film 45 and an undoped polysilicon layer are formed on an entire surface, and etched selectively by photolithography or the like (not shown) to form polypattern layers 46a and 46b. A blocking layer 47 is formed of oxide film (or nitride film and the like) on an entire surface inclusive of the polypattern layer 46a and 46b, and planarized by CMP or the like until top surfaces of the polypattern layers 46a and 46b are exposed. Then, a cobalt layer 48 is deposited on an entire surface inclusive of the polypattern layers 46a and 46b and the blocking layer 47.

Figure 3B:
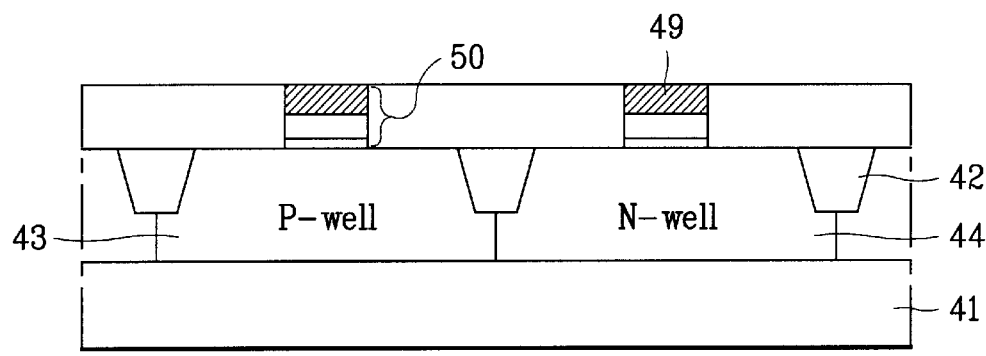
Figure 3C:
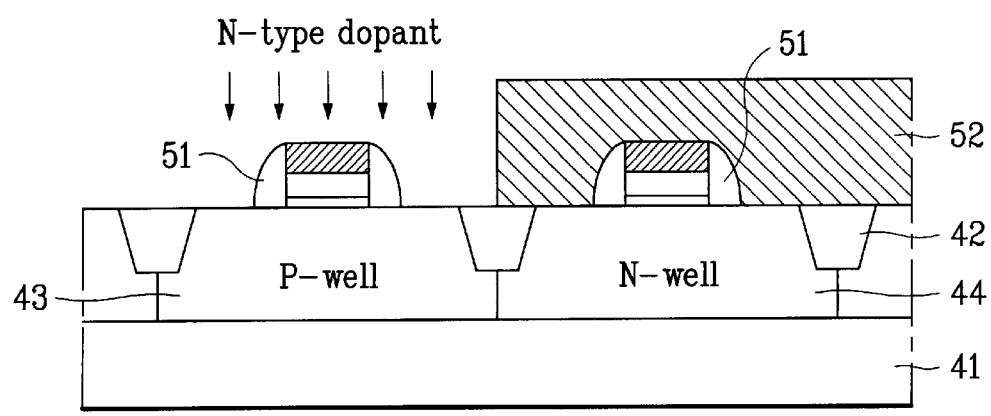

As shown in FIG. 3B, annealing is conducted to form a cobalt silicide layer 49 and form a gate electrode. In this instance, the cobalt layer 48 on the blocking layer 47 that does not react with silicon is removed preferably by a wet chemical process. As shown in FIG. 3C, the blocking layer 47 is removed, and an insulating film is formed and subjected to anisotropic etching, which leaves the insulating layer only at sides of the gate electrode 50, to form gate sidewalls 51. A photoresist film is coated on an entire surface and selectively patterned to leave the photoresist film only on the N type well region 44 to form a first photoresist film pattern layer 52. The first photoresist film pattern layer 52 is used as a mask in implanting n type ions in an exposed surface of the substrate in the P type well region 43 and the gate electrode 50.

Figure 3D:
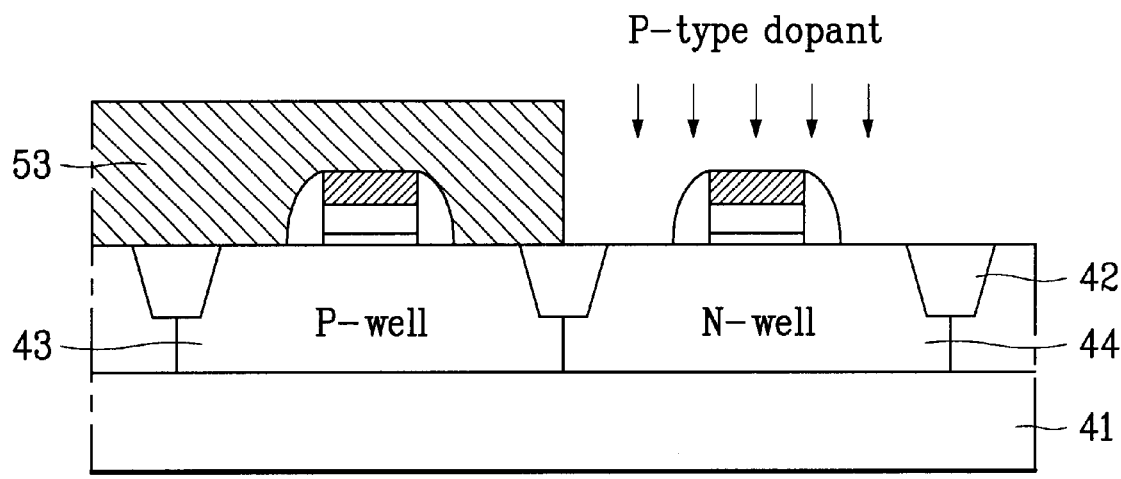

As shown in FIG. 3D, the first photoresist film pattern layer 43 is removed and a photoresist film is coated on an entire surface again. The coated photoresist film is selectively patterned to leave the photoresist film only on the P type well region 43 to form a second photoresist film pattern layer 53. The second photoresist film pattern layer 53 is used as a mask in implanting p type impurity ions in an exposed surface of the substrate and the gate electrode 50.

Figure 3E:
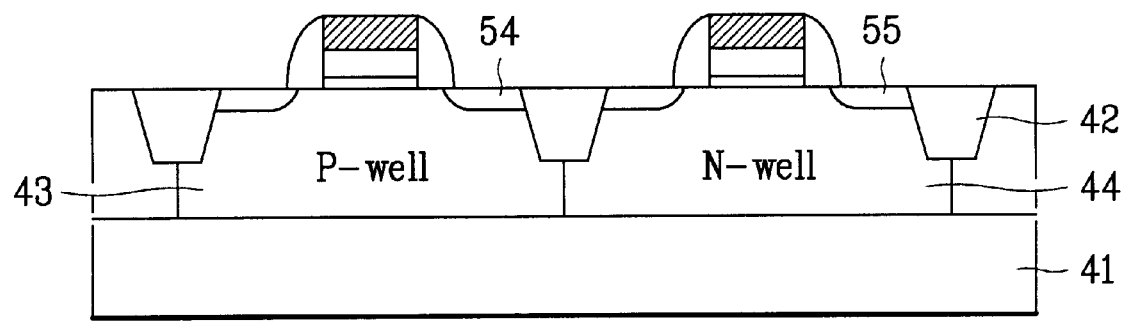

As shown in FIG. 3E, annealing is preferably conducted to form n type source/drain 54 and p type source/drain 55 in an NMOS and a PMOS regions respectively, and the second photoresist film pattern layer 53 is removed. In this instance, As, P, and B may be used as dopant for forming the source/drain of the NMOS and PMOS. Since cobalt silicide reacts enough with As, P, and B to be used as a diffusion source, even if the ions are implanted in the cobalt silicide, the ions are diffused into the polypattern layers, which allows the dual gate to be formed.

As described above, preferred embodiments of a method for fabricating a polycide gate have various advantages. First, $CoSi_2$, which has an excellent thermal stability and a low resistance, can be patterned using a time and cost efficient fabrication process. Since a buried channel PMOS can not be formed in a device with a gate length below 0.25 $\mu$m, two sheets of masks for forming a polypattern layer and source/drain are respectively required in formation of a dual gate. However, since ions are implanted to the source/drain on the same time with $CoSi_2$/poly gate and annealed according to the preferred embodiments, a fabrication process has a reduced number of steps and is simplified. Further, since ions are implanted in the polysilicon layer, which is used as a gate, not directly, but diffusing ions implanted in the cobalt silicide, the polysilicon layer can be formed thinner (e.g., below 500 Å) so that a low energy ion implanting equipment can be eliminated. Also, in comparison to tungsten silicide the resistivity is lowered by approximately $\frac{1}{5}$, which permits independent adjustment of a gate thickness regardless of a salicide forming process. In the case of deposition of tungsten on a polysilicon layer, an additional diffusion prevention film, such as TiN or WN, is required to prevent a reaction between tungsten and silicon, however, the preferred embodiments require no diffusion prevention film. A selective oxidation is required in the related art when tungsten is used and the re-oxidation for restoring damage to the gate oxide film can be achieved within appropriate ranges of an $H_2/O_2$ ratio and an oxidation temperature. However, the preferred embodiments according to the present invention provide a simple fabrication process and have reduced or no deterioration coming from oxidation of polycide caused by re-oxidation because the re-oxidation can be proceeded after patterning of the polysilicon layer. In addition, in a memory, such as embedded DRAM, gates for a logic portion and a memory cell portion can be formed of identical material.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A method for fabricating a semiconductor device, comprising:

forming polysilicon pattern layers over first and second regions of a semiconductor substrate;

forming a blocking layer to expose top surfaces of the polysilicon pattern layers;

annealing a refractory metal into the polysilicon pattern layers to form a gate electrode having a refractory metal silicide layer;

implanting ions into the refractory metal suicide layer;

annealing the ion implanted refractory metal silicide layer to diffuse the implanted ions into the polysilicon pattern layers; and forming source/drain regions in surfaces of the substrate on both sides of the gate.

2. The method of claim 1, wherein the forming the source/drain regions is performed before the forming of the blocking layer.

3. The method of claim 2, wherein the forming source/drain regions comprises respectively implanting impurity ions in the first and second regions and annealing, and wherein the implanting impurity ions implants gate ions in the polysilicon pattern layers.

4. The method of claim 1, wherein the blocking layer masks portions of the substrate exposed by the polysilicon pattern layers in the first and second regions, and wherein the annealing the refractory metal further comprises removing portions of the refractory metal that do not react because of the blocking layer.

5. The method of claim 1, wherein sidewalls are formed at sides of the gate electrodes after the forming of the source/drain regions.

6. The method of claim 1, wherein the refractory metal is a cobalt layer is directly deposited on the polysilicon pattern layers after exposing the top surfaces of the polysilicon pattern layers through the blocking layer.

7. The method of claim 1, wherein the gate electrode includes a stack of the refractory metal silicide over the polysilicon pattern layer, and wherein an N type well is in a first region of the semiconductor substrate, and a P type well is in a second region of the semiconductor substrate.

8. The method of claim 1, therein impurity ions in the first and second regions are of opposite conductivities.

9. The method of claim 1, wherein the forming the source/drain regions is performed after the forming of the blocking layer.

10. The method of claim 1, further comprising forming sidewalls for the gate electrodes.

11. A method for fabricating a polycide dual gate in a semiconductor device, comprising:

forming a first conductivity type well region and an second conductivity type well region in surfaces of a semiconductor substrate;

forming a gate oxide film and an undoped polysilicon layer that are selectively etched to form polypattern layers on the well regions;

forming a blocking layer to expose top surfaces of the polypattern layers and mask the well regions;

depositing a cobalt layer on the polypattern layers and the blocking layer;

annealing to form gate electrodes of a polycide structure each with a stack of the polypattern layer and a silicide layer;

forming sidewalls at sides of the gate electrodes; and implanting second conductivity type impurity ions and first conductivity type impurity ions in the first conductivity type well region and the second conductivity type well region, respectively, and diffusing to form source/drain regions, wherein the diffusing to form the source/drain regions is performed by annealing, and wherein the ion implantation to form the source/drain regions implants ions in the silicide layer and the silicide layer is used as a diffusion source to diffuse the impurity ions to the polypattern layer in the annealing.

12. The method of claim 11, wherein the gate electrodes are formed by a reaction of silicon in the polypattern layers with the cobalt layer to form the silicide layer being a cobalt silicide layer.

13. The method of claim 11 wherein the forming a blocking layer comprises forming one of a nitride film and an oxide film on an entire surface that is etched by chemical mechanical polishing to expose the top surfaces of the polypattern layers.

14. A method for fabricating a semiconductor device, comprising:

forming polysilicon pattern layers over first and second regions of a semiconductor substrate;

forming a blocking layer to expose top surfaces of the polysilicon pattern layers;

forming a cobalt layer on the top surface of the blocking layer and the polysilicon pattern layers;

annealing the cobalt layer to form a $CoSi_2$ layer;

implanting ions into the $CoSi_2$ layer;

annealing the ion implanted $CoSi_2$ layer to diffuse the implanted ions into the polysilicon pattern layers; and forming source/drain regions in the semiconductor substrate.

15. The method of claim 14, wherein the $CoSi_2$ layer comprises a SADS (silicide as a dopant source) to implant ions in the polysilicon layer.

16. The method of claim 15, wherein the ions implanted in the polysilicon layer consist of diffused ions from the $CoSi_2$ layer.

17. The method of claim 14, wherein the ions are implanted in the polysilicon layer not directly, but by diffusing ions implanted into the $CoSi_2$ layer.

18. The method of claim 1, wherein the ions are implanted in the polysilicon pattern layers not directly, but by diffusing ions implanted into the refractory metal silicide layer.

* * * * *